(12) United States Patent
Gregorius et al.

(10) Patent No.: US 7,313,211 B2
(45) Date of Patent: Dec. 25, 2007

(54) METHOD AND APPARATUS FOR PHASE DETECTION

(75) Inventors: Peter Gregorius, München (DE); Edoardo Prete, München (DE); Paul Wallner, Prien (DE)

(73) Assignee: Infineon Technologies AG, Munich (DE)

( * ) Notice: Subject to any disclaimer, the term of this patent is extended or adjusted under 35 U.S.C. 154(b) by 622 days.

(21) Appl. No.: 10/407,033

(22) Filed: Apr. 3, 2003

(65) Prior Publication Data

US 2004/0001566 A1    Jan. 1, 2004

(30) Foreign Application Priority Data

Apr. 5, 2002   (DE) ............................... 102 15 087

(51) Int. Cl.
*H03D 3/24*        (2006.01)

(52) U.S. Cl. ................. 375/375; 375/354; 375/371

(58) Field of Classification Search ............... 375/375, 375/354, 371
See application file for complete search history.

(56) References Cited

U.S. PATENT DOCUMENTS

| 7,061,276 B2* | 6/2006 | Xu ................................ 327/2 |
| 2002/0033714 A1* | 3/2002 | Perrott ........................ 327/12 |
| 2002/0085657 A1* | 7/2002 | Boerstler ..................... 375/373 |
| 2004/0001566 A1* | 1/2004 | Gregorius et al. .......... 375/355 |

FOREIGN PATENT DOCUMENTS

| DE | 689 13 243 T2 | 8/1994 |
| DE | 44 43 417 C1 | 2/1996 |
| DE | 696 08 082 T2 | 9/2000 |
| DE | 199 48 690 A1 | 4/2001 |

* cited by examiner

*Primary Examiner*—David C. Payne
*Assistant Examiner*—Nader Bolourchi
(74) *Attorney, Agent, or Firm*—Peter F. Corless; Christine C. O'Day; Edwards Angell Palmer & Dodge LLP (57) ABSTRACT

The present invention relates to a method and apparatus for generating an output signal in dependence on a phase difference between two periodic signals. The present invention is particularly useful in phase locked loops and delay locked loops, in which a controllable oscillator or a controllable delay device is controlled on the basis of the phase difference determined by means of phase detection, in such a way that a control signal can be obtained, the phase lag or frequency of which has a firm relationship to the reference signal.

31 Claims, 8 Drawing Sheets

PRIOR ART

METHOD AND APPARATUS FOR PHASE DETECTION

The present invention relates to a method as well as apparatus for generating an output signal in dependence on a phase difference between two periodic signals.

Methods or apparatus for phase detection or evaluation of a phase difference between two periodic signals are used in particular in phase locked loops and delay locked loops, in which a controllable oscillator or a controllable delay device is controlled on the basis of the phase difference determined by means of phase detection, in such a way that a control signal can be obtained, the phase lag or frequency of which has a firm relationship to the reference signal. Circuits of this kind are used, for example, in radio transmission technology to provide several defined frequencies.

Also, methods or apparatus for phase detection and automatic control loops based on these are used in communication technology, in which frequently there is the need to recover on the one hand the originally transferred data and on the other hand the appropriate clock information from a serial bit data stream of a received signal. This method is normally called "Clock and Data Recovery" (CDR).

Figure 10:
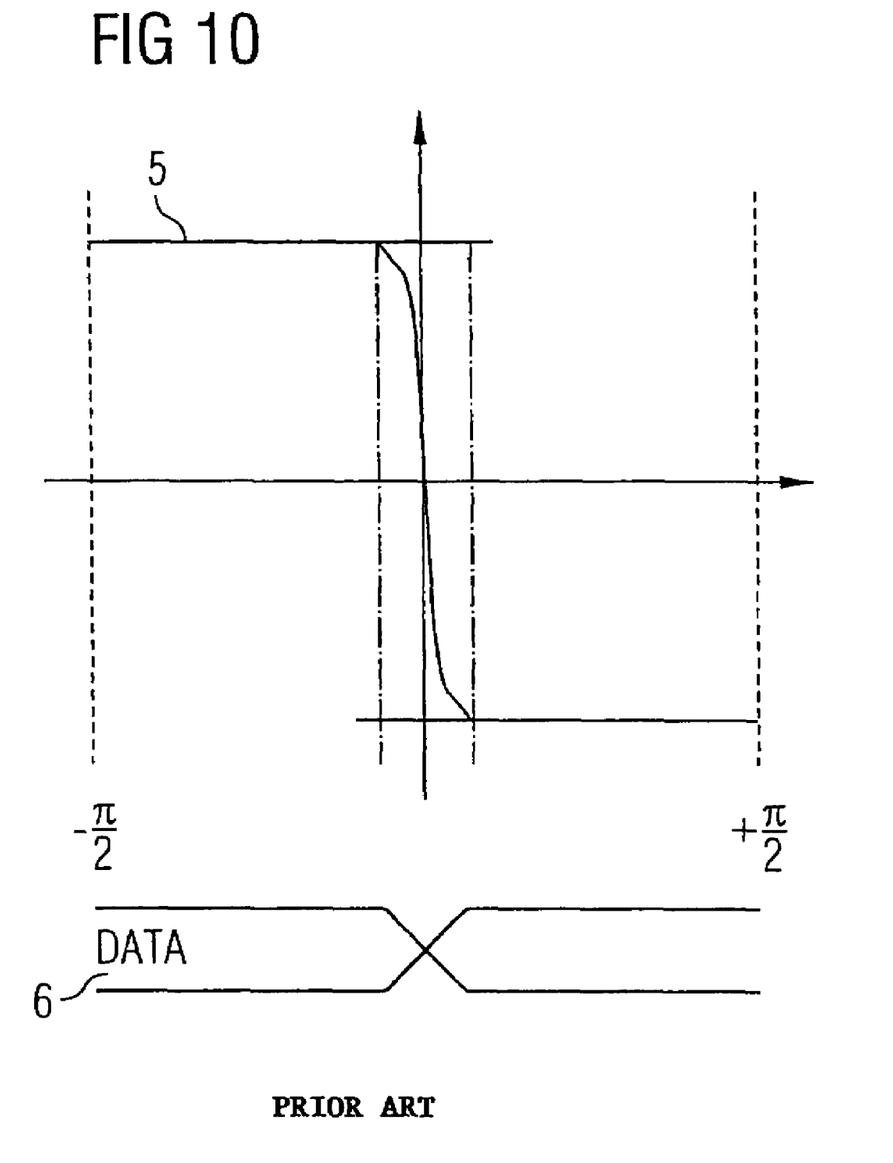
FIG. 10 shows the output signal of a phase detector in the case of a method for phase detection according to the state of the art.

In principle, a distinction is made between two different types of phase detectors. These are called binary and linear phase detectors. The output signal in the case of binary phase detectors can only assume two signal states. If the phase difference between the compared signals is positive, the output signal assumes a first state, whereas the output signal assumes the second state if the phase difference is negative. The behaviour of a binary phase detector of this kind is illustrated in FIG. 10, whereby a signal 5 in dependence on the phase difference between a data signal 6 and a control signal can assume two states, which change at a phase difference of $0\pi$.

By contrast, in the case of linear phase detectors, the amplitude and/or the pulse width of the output signal is proportional to the phase difference. With linear phase detectors, yet another general distinction is possible. Simple linear phase detectors only have gates and no memory elements. Although these are normally structured more simply, they are only able to handle minor phase differences in the signals being compared. On the other hand, the situation in the case of phase detectors, which represent a state automaton, is different. These consist of gates and memory elements, for example D flip-flops. With such phase detectors, a thorough check is required, so that certain combinations of input situations or error situations do not lead to any states, which would not allow further return to zero. In contrast to the type of linear phase detector first mentioned, this second type is able to handle both phase differences and greater frequency differences. The so-called 3-state phase detector, for example, is allocated to this group.

With the criterion of applications for high data rates, the following statements can also be made regarding binary and linear phase detectors. The linear characteristic with linear phase detectors can only be realised by output signals, the pulse width of which is much shorter than the data period. This makes substantial demands on the processing circuit technology. However, a disadvantage with binary phase detectors is the effect that minor changes around the zero point of the phase error lead to major amplifications. But minor amplification just near the zero point would be desirable due to simultaneous amplification of jitter.

Generally, when recovering the clock rate in a data signal, it must be made clear in a data signal whether a RZ (return to zero) or NRZ (non return to zero) data stream is present. In contrast to phase detectors, which are used when comparing two clock pulses (for example, frequency synthesis by means of a phase control loop), a data signal is compared with a clock pulse when the clock rate is recovered, in order to reconstruct the data clock. The data signal transmits information and is therefore not a continuous "10" sequence, but in dependence on the definitions of the standard can have monotonous "0" or "1" sequences up to a certain duration. In such cases, it is difficult without a clock pulse for the receiver to recognize how many zeros or ones are actually transmitted. A terminal for receiving serial bit data must therefore be equipped with additional apparatus for clock recovery.

If an RZ data signal is present, clock recovery is relatively simple. With strong noise, a multiplier is suitable as phase detector, while in the case of applications with little noise an exclusive-OR-gate is sometimes sufficient. During monotonous sequences, no synchronization takes place, as the result of which with a long duration synchronization can be lost.

An important advantage of NRZ data compared to RZ data is that only about the half bandwidth is needed. However, the problem here is that an NRZ data signal does not possess any signal component, which includes the clock frequency. Therefore, a circuit is necessary which can detect edge changes in the data stream. The synchronization signal can then be obtained from this.

The underlying object of the present invention is therefore to create a method or apparatus for generating an output signal in dependence on a phase difference between two periodic signals, in the case of which the output signal can be generated reliably and at low cost, whereby advantageous control behaviour of a phase locked loop or a delay locked loop can be achieved.

This object is achieved according to the invention by a method with the features of claim 1 or apparatus with the features of claim 24. The subclaims in each case define preferred and advantageous embodiments of the present invention.

According to the invention, the reference signal is scanned at several sampling time points within a period of the control signal and in dependence on these samplings the output signal is generated whereby the output signal assumes one of at least three states. In particular, the reference signal is scanned in binary format, so that a binary sample results. This binary sample can then be converted by means of suitable circuits into a state for the output signal.

The sampling time points are calculated in particular from when a period of the control signal begins and can be generated, for example, by several delay elements. Further, the sampling time points can be obtained by means of a shift register, which is clocked by multiplication of the frequency of the reference signal.

Each state change or edge change of the reference signal can be sampled accurately by means of several samplings. Therefore, a statement about these is possible on the basis of the samplings between the sampling time points of which an edge change of the reference signal has occurred, and thus in the period of which the phase difference between the reference signal and the control signal lies.

The output signal as a measurement of the phase difference can be generated by means of the solution according to the invention without a state automaton, so that advantageously the case cannot arise that the phase detector cannot liberate itself from a state. This leads to very robust operation of the phase detector, since the pattern resulting from the samplings can always be projected without ambiguity onto a state irrespective of the preceding operating states.

The samplings are generated advantageously with memory elements, on the data input of which the reference signal is applied in each case and the clock inputs of which are activated staggered in time. As soon as a buffer is enabled, it receives the state of the reference signal applied at this time exactly on its data input in its memory, which is transmitted via an output line. After the last buffer has been enabled within a period of the control signal, the samplings of the reference signal are provided on the outputs of the buffers. These samplings, which result in a binary word in the case of binary sampling, can then be projected by means of a suitable logic circuit onto the output signal. The output signal again can consist of an analogue signal, which can assume several defined voltage or current levels. Besides, it is also possible to transmit the output signal as a digital value. In the latter case, the result of the samplings can be projected by means of a suitable Boolean logic onto the output signal. This concatenation can be achieved by suitable gates or also by means of a programmable logic device (PLD). If the output signal has a digital value, the different states of the output signal can be formed by successive values of the digital value. In this case, for example, four states of the output signal can be represented by two digits or output lines. Advantageously, however, a separate line is used for each state of the output signal, which can assume an active and an inactive state. In this case, the logic allocation of a certain sampling pattern can be reduced to a certain state of the output signal or a certain line or the subsequent sub-assemblies can be activated more simply.

Since the samplings of the reference signal succeed one another in time, the result of the samplings changes up to the time point of the last sampling and the result of the projection of the result of the samplings onto the output signal can change so that under certain circumstances the output signal temporarily assumes an incorrect state. In order to prevent this, it can be arranged that the output signal is only generated or released if the last sampling time point has passed or all samplings have been obtained. For this purpose, for example, the output signal can be generated and fed to a release device, which renders the output signal inactive and only connects the output signal generated at the last sampling time point. If buffers enabled staggered in time are used to sample the reference signal, the release device for the output signal can be activated by the same signal, as the buffer for obtaining the chronologically last sampling. Furthermore, it can be arranged that the output signal is generated or released a certain first time duration after the last sampling of the reference signal. In this way, possibly existing response times can be taken into account, which expire before the last sampling is obtained and the output signal is generated from the result of the samplings. Such a release circuit can for example be formed in the case of high active output lines by AND-gates.

When the output signal is generated, intermediate signals can be produced dependent on the samplings of the reference signal, which indicate, between what sampling time points a state change of the reference signal has taken place. For this purpose, the samplings of chronologically adjacent sampling time points are compared with one another and, if a difference is detected, an intermediate signal is generated, which indicates a state change during the period observed. In the case of binary sampling of the reference signal, for this purpose an exclusive-OR-gate of the samplings of chronologically adjacent sampling time points suffices. For N sampling time points therefore N−1 intermediate signals result. Since the intermediate signals are generated in dependence on the samplings, the intermediate signals are also only valid at the last sampling time point, since before this time point not all the samplings are yet obtained. In order to prevent incorrect generation of the output signal or the occurrence of missing pulses before this time point, the intermediate signals can be buffered, whereby the intermediate signals are only transferred to the buffer at or after the last sampling time point. Similarly to the release device for the output signal, the buffer for the intermediate signals can also be enabled by the signal, with which a buffer for scanning the reference signal is enabled at the last sampling time point. Furthermore, similar to the release device buffering of the intermediate signals can be delayed by a second time duration in order to take into account a necessary response time to generate the intermediate signal.

Advantageously, the samplings of the reference signal are checked for the occurrence of an error, in order to prevent an incorrect output signal being generated. In addition to this, if an error is detected the output signal can be generated in such a way that it assumes a certain state, which indicates the occurrence of an error. If the phase detector is used in a phase locked loop or delay locked loop, this error signal, for example, can be utilized to leave the activation of an oscillator or delay device unchanged, since an incorrectly generated output signal and thus incorrect activation of the oscillator or the time lag device must be assumed.

When the samplings of the reference signal are checked it can be monitored in particular whether in the course of the sampling time points no or more than one state change of the reference signal has occurred. This cannot be the case with normal progression of the reference signal and error-free sampling of the reference signal. In particular, the intermediate signals are suitable for this plausibility check, as they indicate for each gap between the sampling time points, whether a state change of the reference signal has taken place in this gap. In the error-free case, only one intermediate signal may be active. If more than one intermediate signal or no intermediate signal is active, this indicates that no or more than one state change of the reference signal has taken place during the sampling time points and thus a reliable statement about the phase difference between the reference signal and the control signal is not possible. When the error signal is generated or when plausibility is checked in addition to the intermediate signals the samplings of the reference signal itself can also be consulted.

The invention is described below in more detail on the basis of preferential embodiments with reference to the appended drawings.

The signal 5 in dependence on a phase difference between two periodic signals, shown in FIG. 10, represents the result of binary phase detection in accordance with the state of the art. The output signal 5 in this case can assume two states. The first upper state is assumed in the case that the phase lag is <0, whereas the second lower state is assumed if the phase lag >0, whereby the phase lag is only observed within the range of $-\pi/2$ to $+\pi/2$. These two output signals can be used for controlling an oscillator in a phase locked loop, so that in the case of a phase lag <0 a high signal is transmitted to increase the frequency of the oscillator and in the case of a phase lag >0 a low signal to reduce the frequency of the oscillator. Disadvantageously, in this case the output signal 5 can oscillate between these two concrete states. A disadvantage with such binary phase detectors has the effect that the minor changes around the zero point lead to major amplifications. However, a small amplification just near the zero point would be desirable due to the simultaneous amplification of jitter.

Figure 1:
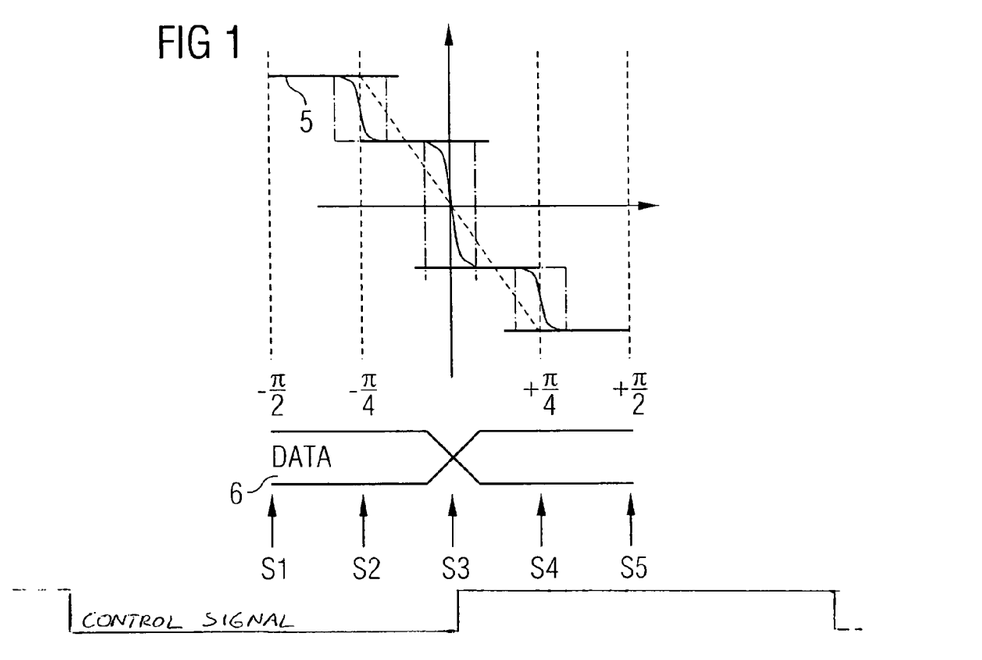
FIG. 1 shows a signal generated by means of a method according to a first embodiment of the present invention in dependence on a phase lag between a reference signal and a control signal with five equidistant sampling time points.

FIG. 1 depicts a signal 5 in dependence on a phase lag between a reference signal 6, which is a data signal, and a control signal whereby the signal 5 has been generated by a method according to a first embodiment of the present invention. Below in FIG. 1, five sampling time points S1-S5 are indicated, which in regard to their phase position with respect to the control signal lie at $-\pi/2$, $-\pi/4$, $0\pi$, $+\pi/4$ and $+\pi/2$. These five sampling time points S1-S5 define four areas for the phase lag of the reference signal 6 to the control signal. Depending on where the phase difference between the reference signal 6 and the control signal lies in these phase difference areas, the signal 5 assumes one of four states. The signal 5 in the present case is an analogue signal, which can assume four defined voltage or current values. The signal 5 is directly suitable for controlling an oscillator in a phase locked loop or delay element in a delay locked loop. In the regulated target state, the phase difference moves around the zero point, that is to say in the area between the sampling time point S2 and the sampling time point S4. With the solution according to the invention this only leads to fluctuations of the signal 5 between two levels which are closer to each other than in the case of binary phase detector. If, for example, with the transient effect or excursions from the regulated state the phase lag becomes longer or shorter and leaves the area between the two sampling time points S2 and S4, the signal 5 can still increase or reduce a stage further and thus exert a greater control effect.

The transmission curve for phase difference to the signal 5 is primarily determined by the number of sampling time points and their position. The higher the number of sampling time points, the closer the transfer characteristic approaches that of a linear phase detector. Additionally, there is the possibility of reducing the gaps between the sampling time points in particular around the zero point of the phase lag. This leads in the case of the zero point to a flat curve, which gets steeper the greater the deviation from the zero point.

Figure 2:
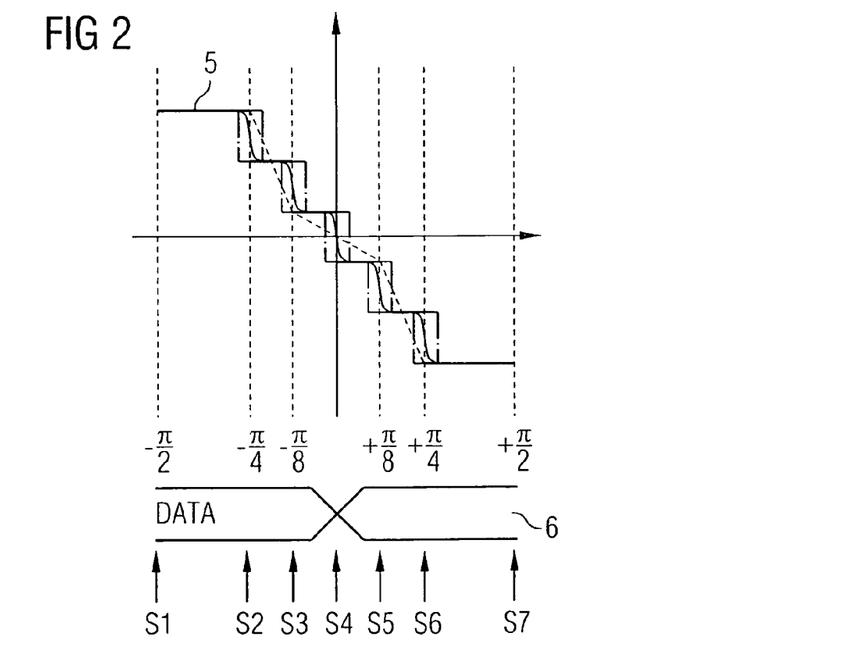
FIG. 2 shows a signal generated by means of a method according to a second embodiment of the present invention in dependence on a phase lag between a reference signal and a control signal with seven not equidistant sampling time points.

FIG. 2 shows the progression of the signal 5 in dependence on the phase lag with seven sampling time points S1-S7, whereby the sampling time points are not equidistant. The sampling time points lie at $-\pi/2$, $-\pi/4$, $-\pi/8$, $0\pi$, $+\pi/8$, $+\pi/4$ and $+\pi/2$. This leads to a progression of the curve 5 mentioned above, which is flatter in the proximity of the zero point.

Figure 3:
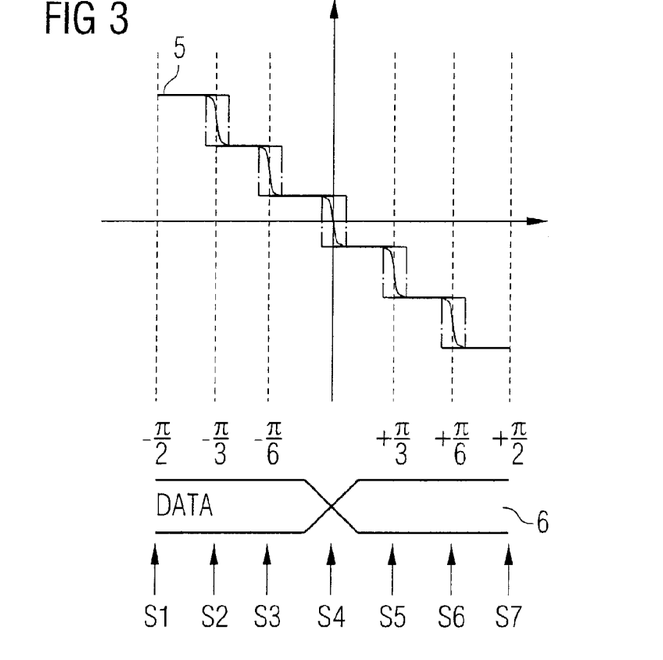
FIG. 3 shows a signal generated by means of a method according to a third embodiment of the present invention in dependence on a phase lag between a reference signal and a control signal with seven equidistant sampling time points.

The progression of the curve 5 in accordance with a third embodiment of the present invention is shown in FIG. 3, whereby also here seven sampling time points S1-S7 are proposed, which are, however, equidistant.

In addition to the distribution and number of sampling time points S1-S7 there is still the possibility of assigning a freely selectable defined state for the signal 5 to each phase lag area between two adjacent sampling time points, so that the transfer characteristic can also be adapted in this way to the requirements of phase detection.

Figure 4:
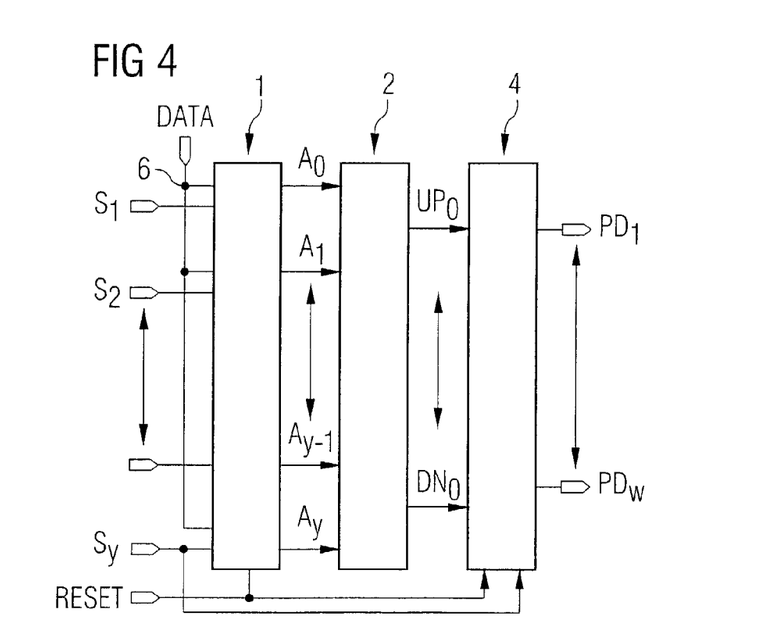
FIG. 4 shows the schematic basic structure of apparatus to carry out the method according to the invention in accordance with one of the embodiments.

FIG. 4 shows the schematic structure of apparatus for implementing the method according to the invention. The apparatus comprises a binary sampling unit 1, which has several buffers internally, to the inputs of which the reference signal 6 is applied. The buffers are enabled in each case by a pulse, which takes place at a sampling time point Sl-Sn, whereby as a result of a buffer being activated the binary state of the reference signal 6 applied at this time point to the buffer is transferred to the buffer. The samplings $A_0$-Ay are provided at the output of the sampling unit 1. The samplings $A_0$-Ay represent the output signals of the buffers in the sampling unit 1. To an evaluation unit 2, which generates intermediate signals $UP_0$-$DN_0$ on the basis of the samplings $A_0$-Ay, the samplings $A_0$-Ay are applied. The number of the intermediate signals $UP_0$-$DN_0$ is equal to the number of samplings $A_0$-Ay or sampling time points S1-Sn minus 1. Each intermediate signal $UP_0$-$DN_0$ is assigned to a gap between two chronologically adjacent sampling time points Sl-Sy or samplings $A_0$-Ay. The evaluation unit 2 in each case compares two chronologically adjacent samplings $A_0$-Ay and if a difference is detected renders the intermediate signal $UP_0$-$DN_0$ assigned to this gap active. This means that a state change or an edge change of the reference signal 6 has taken place in the gap concerned. The present described methods serve to detect phase in a phase locked loop or delay locked loop, which aims at a regulated state with a defined constant phase lag. For this reason, the intermediate signals are divided into UP signals and DN signals (down signals). As soon as the phase difference lies between the reference signal 6 and the control signal above a target phase difference, an UP signal is active, whereas a down signal is active as soon as the phase difference is below the target phase difference. The difference between UP intermediate signals and DN intermediate signals only consists in the fact that with an active UP signal a control pulse is generated, which leads to an increase in the phase difference, and with an active DN intermediate signal a control pulse is generated, which leads to a reduction in the phase difference. The target phase difference then lies at the sampling time point S1-S7, which is positioned between the two phase difference areas, to which the intermediate signals $UP_0$-$DN_0$ are assigned, as a result of which the UP signals change to DN signals. In principle, the change from UP intermediate signals to DN intermediate signals can be placed at will, whereby in practice to achieve a symmetrical characteristic the target phase difference is placed in the middle of the sampling time points Sl-Sy.

An error recognition unit 4 is joined to the evaluation unit 2, which checks the intermediate signals $UP_0$-$DN_0$ for plausibility. Additionally, the samplings $A_0$-$Ay$, which are then also consulted for error recognition can also be applied to the error recognition unit 4. The output signal $PD_1$-$PDw$ is then provided at the output of the error recognition unit 4. In this case, the output signal is formed by one multi bit word, whereby each position of $PD_1$-$PDw$ indicates a state of the output signal. The error recognition unit 4 monitors whether more than one intermediate signal $UP_0$-$DN_0$ is active. Since with normal progression of both the reference signal 6 as well as the control signal only one edge change of the reference signal 6 and thus only one active intermediate signal $UP_0$-$DN_0$ can occur, a second active intermediate signal $UP_0$-$DN_0$ indicates a corrupted state, which is unsuitable for evaluation. In this case, an error signal appears in the error recognition unit 4, which can be evaluated in different ways. For example, the case of an error can represent a state of the output signal, whereby for example the error signal as separate line can form a component part of the output-side multi bit word $PD_1$-$PDw$ to achieve this. Such an error signal can be evaluated in particular by subsequent regulation of a phase locked loop or delay locked loop, in order in the event of an error to suppress a change in the control value of an oscillator of a phase locked loop or delay device of a delay locked loop.

If the output signal of the error recognition unit 4 is formed by several output lines $PD_1$-$PDw$ one of which is active in each case in dependence on the intermediate signals and as a result exerts a control effect on an oscillator or delay device, the error signal in the error recognition unit 4 can be used in the event of an error to block all output lines $PD_1$-$PDw$ or to render these inactive, in order to prevent incorrect activation of the oscillator or the time lag device.

FIG. 4 shows an embodiment of an apparatus to implement the method according to the invention in accordance with the first embodiment of the present invention. The progression of the signal 5, which is shown in FIG. 1, can be generated by means of the apparatus shown in FIG. 5. In the case of this embodiment, five sampling time points are proposed, which serve to enable the buffers in the sampling unit 1. A sampling $A_0$-$A_4$ is generated for each of these five sampling time points S1-S5, which are applied to the evaluation unit 2. The evaluation unit 2 contains four exclusive-OR-gates to compare two chronologically adjacent samplings $A_0$-$A_4$. The outputs of the exclusive-OR-gates of the evaluation unit 2 represent the intermediate signals, which indicate a state change of the reference signal 6 for the gap concerned. The evaluation unit 2 also includes a buffer unit 3, which consists of four buffers, the inputs of which are impinged by the outputs of the exclusive-OR-gates in the evaluation unit 2. The buffers of the buffer unit 3 are enabled jointly by the pulse, which serves to generate the last sampling $A_4$ at the sampling time point 5. Then the intermediate signals $UP_0$-$UP_1$, $DN_0$-$DN_1$ are provided at the output of the buffers of the buffer unit 3. The buffer unit 3 prevents, in course of the samplings $A_0$-$A_4$ generated chronologically after one another, the output signals of the exclusive-OR-gates alternating in the evaluation unit 2 resulting in undesirable states in a downstream error recognition unit 4. The intermediate signals $UP_0$-$UP_1$, $DN_0$-$DN_1$ lying on the output of the buffer unit 3 are fed to the error recognition unit 4, where in a first stage $UP_0$-$UP_1$, $DN_0$-$DN_1$ are monitored for the presence of an inadmissible state and where in a second stage the output signal $PD_0$-$PD_3$ is generated, which consists of four separate lines, each of which represents a particular state. In this case, the four output lines $PD_0$-$PD_3$ are blocked by means of four AND-gates up to the last sampling time point S5, in order to suppress noise.

Figure 5:
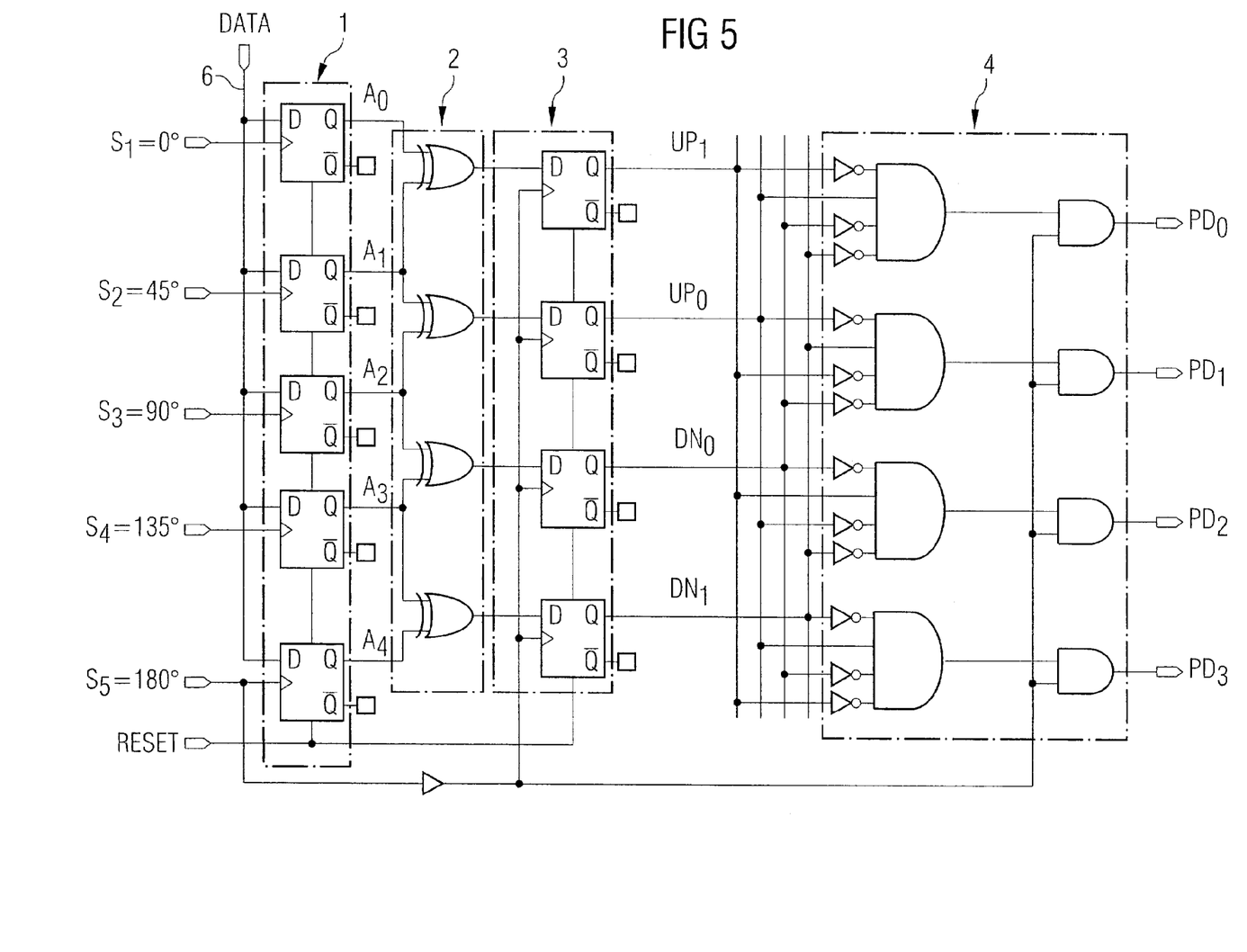
FIG. 5 shows the structure of apparatus to carry out the method according to the first embodiment of the present invention.

The first stage of the error recognition unit 4 comprises four AND-gates with a non-inverting input and three inverting inputs in each case. The non-inverting inputs of the four AND-gates are connected in each case with one of the four intermediate signals $UP_0$, $UP_1$, $DN_0$, $DN_1$, whereby the three inverting inputs of the four AND-gates are connected in each case with the remaining intermediate signals $UP_0$, $UP_1$, $DN_0$, $DN_1$. This means that the outputs of the four AND-gates only become active if an intermediate signal $UP_0$, $UP_1$, $DN_0$, $DN_1$ is active and the remainder are inactive, whereby in each case the AND-gate is active, on the non-inverting input of which the active intermediate signal $UP_0$, $UP_1$, $DN_0$, $DN_1$ is applied. The outputs of these four AND-gates of the first stage in the error recognition unit 4 are further connected to the four AND-gates in the second stage of the error recognition unit 4, which serve to block the output lines $PD_0$-$PD_3$, up to the last sampling time point S5.

Figure 6:
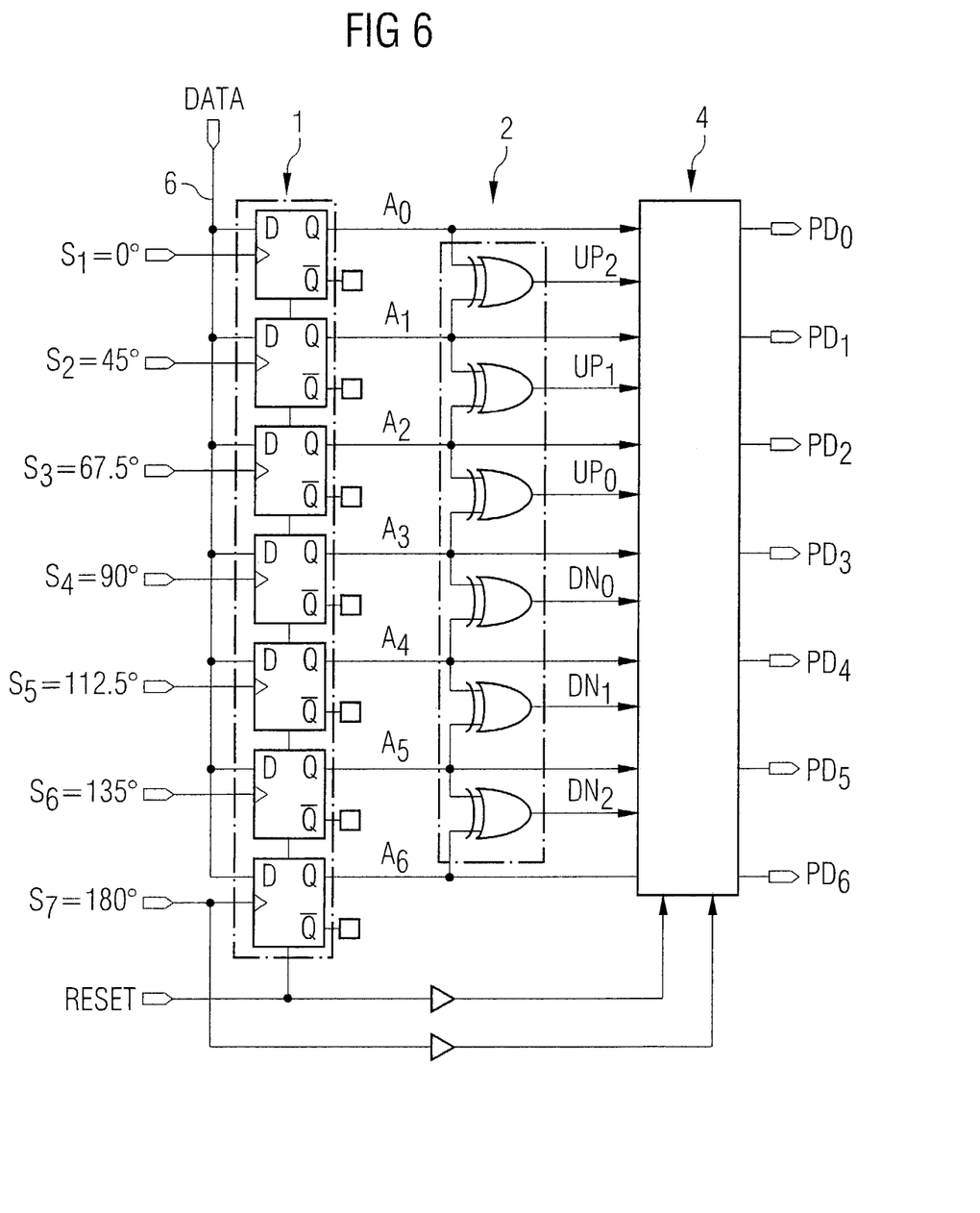
FIG. 6 shows the structure of apparatus to carry out the method according to the second embodiment of the present invention.

FIG. 6 shows an apparatus to implement the method according to the invention in accordance with the second embodiment of the present invention. In contrast to the apparatus according to FIG. 5, seven sampling time points S1-S7 are proposed, from which seven samplings $A_0$-$A_6$ result. The evaluations $A_0$-$A_6$ are also linked in the evaluation unit by means of exclusive-or-gates, whereby in this case no buffer unit 3 is connected after the evaluation unit 2. Therefore, the intermediate signals $UP_0$-$UP_2$-$DN_0$-$DN_2$ are provided directly at the output of the evaluation unit 2. The error recognition unit 4, the inputs of which are impinged both by the intermediate signals $UP_0$-$UP_2$, $DN_0$-$DN_2$ as well as by the samplings $A_0$-$A_6$ and also the samplings $A_0$-$A_6$ is connected to the sampling unit 1 and the evaluation unit 2. The output lines $PD_0$-$PD_6$ are provided at the output of the error recognition unit 4. Since with this embodiment seven sampling time points S1-S7 are proposed, six intermediate signals $UP_0$-$UP_2$, $DN_0$-$DN_2$ are generated. In 35 contrast to the apparatus shown in FIG. 5 in this case the error signal generated in the error recognition unit 4 is transmitted as a defined state of the output signal via an output line $PD_0$. The remaining six output lines $PD_1$-$PD_6$ correspond to the output lines $PD_0$-$PD_3$ of the apparatus shown in FIG. 5 with the difference that due to the seven sampling time points S1-S7 six states are possible, related to the occurrence of a state change of the reference signal 6 in one of six gaps which are limited by the seven sampling time points S1-S7. The error recognition unit 4 activates the seven output lines $PD_0$-$PD_6$ in such a way that only one output line $PD_0$-$PD_6$ is active in each case.

Figure 9:
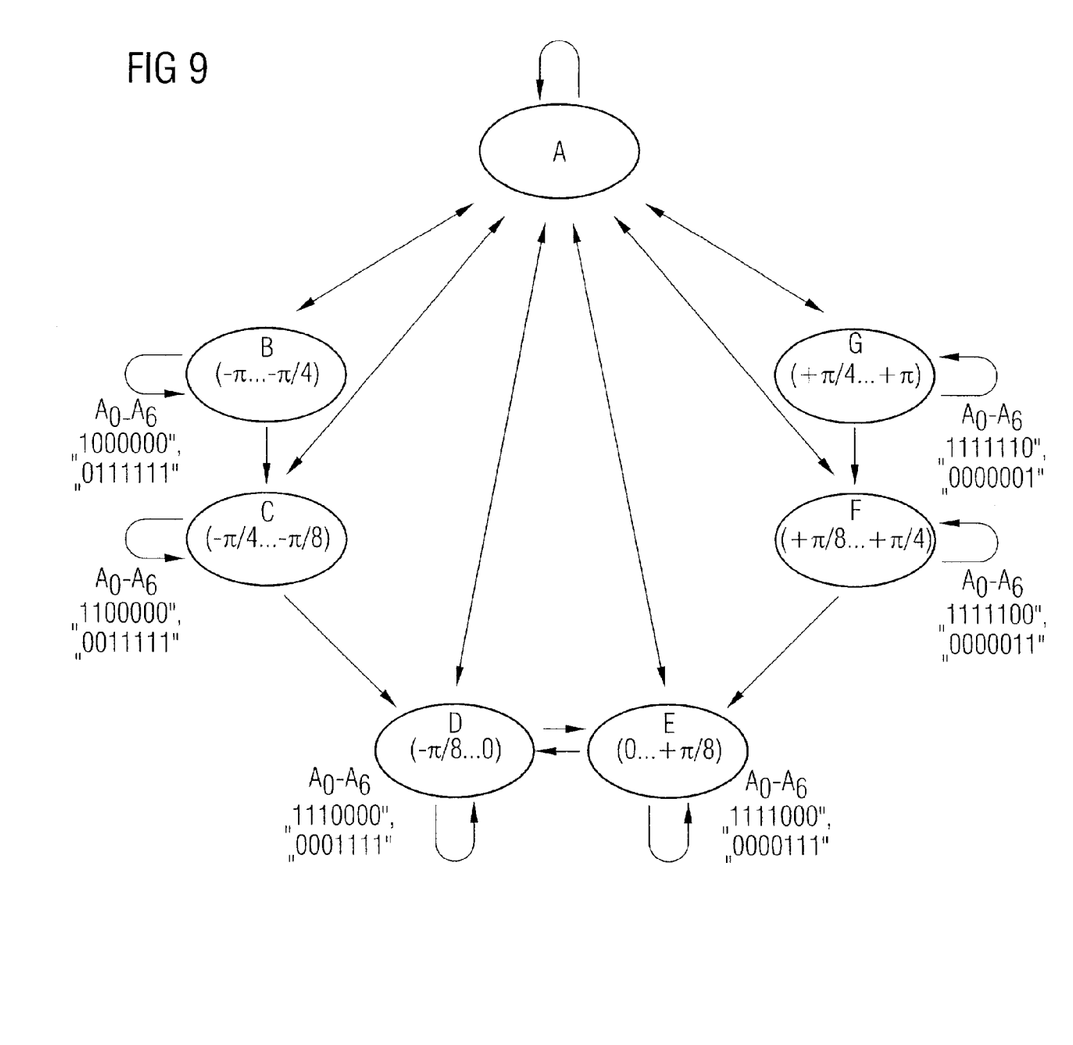
FIG. 9 shows an overview of the possible states of the output signal in the case of the method in accordance with the second or third embodiment of the present invention and its switching behaviour.

The switching behaviour of the output lines $PD_0$-$PD_6$ is clear from the state diagram shown in FIG. 9. The states A-G can be assigned to the output lines $PD_0$-$PD_6$. In this case, one of the states A-G is allocated to each pattern of the samplings $A_0$-$A_6$. The pattern of the samplings $A_0$-$A_6$ to which the state is assigned is indicated in FIG. 9 in regard to the states B-G. The states B-G represent the normal states, that is to say states in the case of which only one edge change of the reference signal 6 has been detected over the total sampling period. In this case, the state of the reference signal 6 can alternate from high to low or from low to high so that with a state change between the first and the second sampling period S1 and S2 for the samplings $A_0$-$A_6$, the following patterns can result: "1000000" and "0111111". Accordingly, the state C is assigned to the patterns of the samplings $A_0$-$A_6$ "1100000" and "0011111". The same applies for the states B-G. Each of these states B-G in this case is assigned to a phase difference which is defined by the chronological position of the sampling time points S1-S7, that limit the gap in which an edge change leads to the corresponding state B-G.

The state A represents the error case, to which all remaining patterns of the samplings $A_0$-$A_6$ are assigned. This means that each result of the samplings $A_0$-$A_6$, which has no state change of the reference signal 6 or more than two state changes of the reference signal 6 leads to the error case A.

The arrows indicate which state is reached from which state in normal operation. The arrow, pointing from each state A-G and towards the related state A-G itself, indicates that if the patterns of the samplings $A_0$-$A_6$ do not change the same state A-G is maintained. Each of the remaining states B-G can be reached in addition to the state A. In addition to state A only state C is reached from state B. From state C in addition to state A only state D, from state D in addition to state A only state F and from state F in addition to state A only state E are reached. From state D state E is reached and vice versa.

The target phase difference is between $-\pi/8$ and $+\pi/8$, so that in the regulated state the two states only alternate between D and E.

Figure 7:
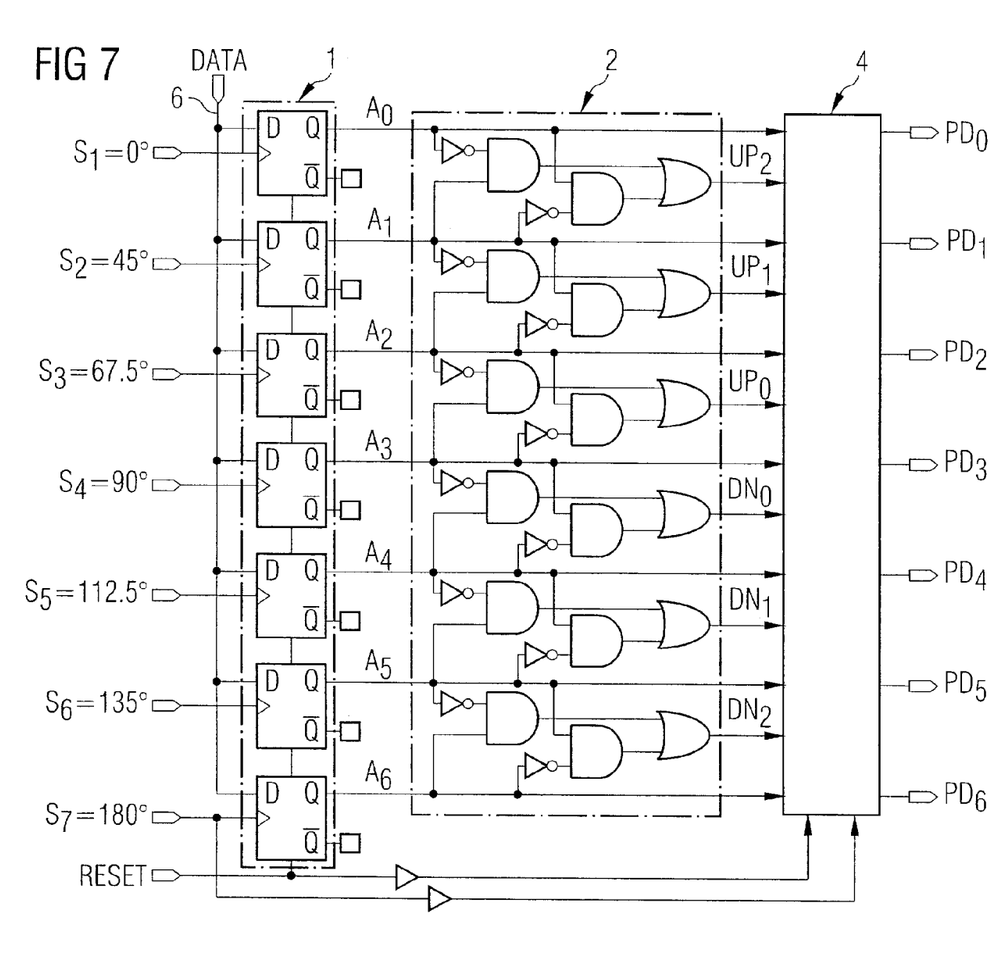
FIG. 7 shows apparatus to carry out the method according to the second embodiment of the present invention in an alternative configuration.

FIG. 7 shows an alternative configuration of the apparatus in accordance with FIG. 6. In this case, the only difference is in the concrete configuration of the evaluation unit 2, in which the exclusive-OR-gates have been replaced by AND-gates, OR-gates and inverters. The logic function in this case has remained unchanged, so that the projection of the samplings $A_0$-$A_6$ onto the intermediate signals $UP_0$-$UP_2$, $DN_0$-$DN_2$ also remains unchanged.

Figure 8:
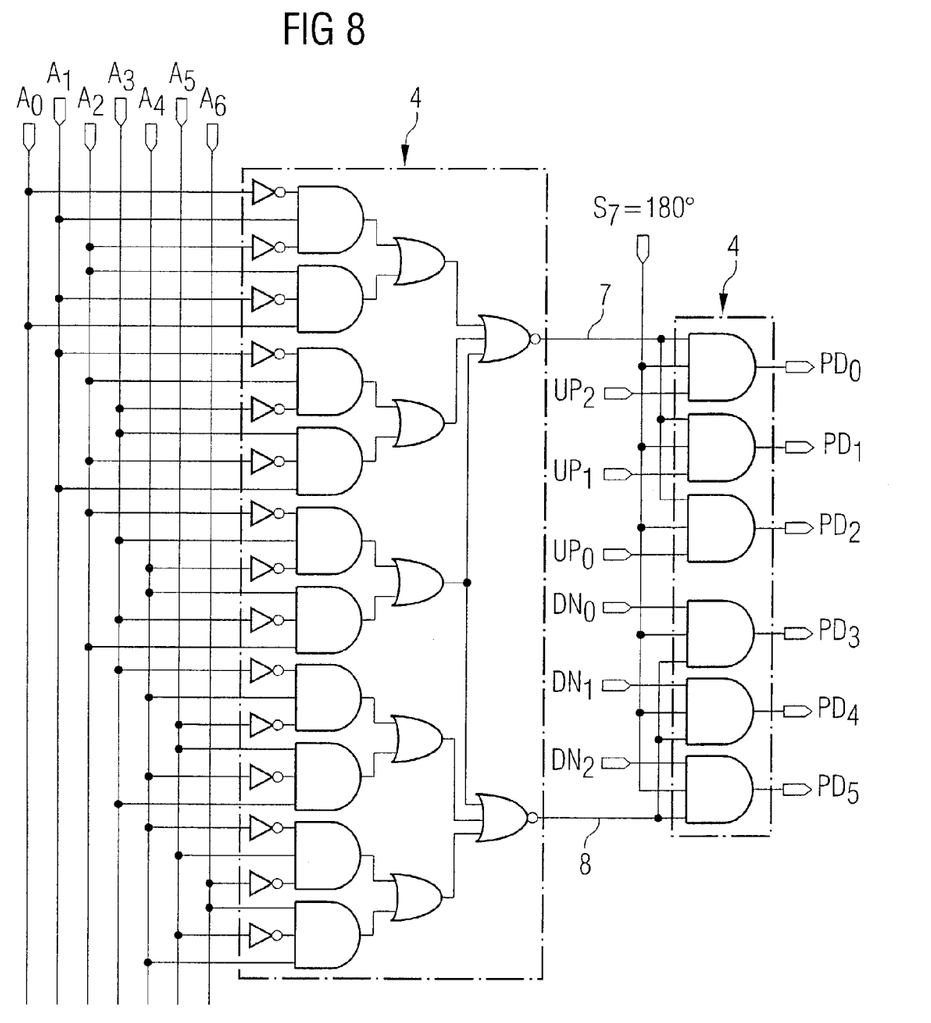
FIG. 8 shows the structure of an error evaluation circuit, which is a component part of the apparatus according to FIG. 6 or 7.

The architecture of the error recognition unit 4 of the apparatus in accordance with FIGS. 6 and 7 is shown in detail in FIG. 8. In this diagram, it can be seen that the error recognition unit 4 comprises two blocks, one of which shown on the left serves to detect an error state and the block shown on the right of the error recognition unit 4 serves to interlock the intermediate signals $UP_0$-$UP_2$, $DN_0$-$DN_2$ in order in the event of an error to render the output lines $PD_0$-$PD_5$ inactive. The function block shown on the left comprises several AND-gates with a non-inverting and two inverting inputs and several AND-gates with two non-inverting and one inverting input. The samplings $A_0$-$A_5$ without the last sampling $A_6$ in each case are connected with the inputs of the AND-gates in such a way that in each case three samplings succeeding one another in time, for example $A_0$-$A_2$, are connected with the inputs of two AND-gates of various types in such a way that in the case of each of the two AND-gates each of the three inputs is connected with another sampling $A_0$-$A_2$. This leads to the fact that the output of an AND-gate in the case of the pattern "010" and the output of the other AND-gate in the case of the pattern "101" of an observed group of three samplings becomes active. In this way, it can be detected if the reference signal 6 changes from one sampling to the next and again changes back from the next sampling to the next one after that. The outputs of the AND-gates are linked as shown in FIG. 8 with further OR-gates, which generate a UP error signal 7 and a DN error signal 8. The projection of the samplings $A_0$-$A_6$ onto the two error signals 7, 8 can be shown as follows:

UP error signal=$[(\overline{A}_0{}^*A_1{}^*\overline{A}_2)+(A_0{}^*\overline{A}_1{}^*A_2)] \mp [(\overline{A}_1{}^*A_2{}^*\overline{A}_3)+(A_1{}^*\overline{A}_2{}^*A_3)] \mp [(\overline{A}_2{}^*A_3{}^*\overline{A}_4)+(A_2{}^*\overline{A}_3{}^*A_4)]$ DN error signal: $[(\overline{A}_2{}^*A_3{}^*\overline{A}_4)+(A_2{}^*\overline{A}_3{}^*A_4)] \mp [(\overline{A}_3{}^*A_4{}^*\overline{A}_5)+(A_3{}^*\overline{A}_4{}^*A_5)] \mp [(\overline{A}_4{}^*A_5{}^*\overline{A}_6)+(A_4{}^*\overline{A}_5{}^*A_6)]$ The two error signals 7, 8 are applied to the block shown on the right of the error recognition unit 4, which serves as release block and has six AND-gates with three non-inverting inputs in each case. In this case, the UP error signal 7 is applied to the upper three AND-gates and the DN error signal 8 is applied to the lower three AND-gates of the release block in the error recognition unit 4 in each case. To each of these six AND-gates in the evaluation block an intermediate signal $UP_0$-$UP_2$, $DN_0$-$DN_2$ as shown in FIG. 8 is applied. In addition, to the third non-inverting input of each AND-gate the signal, which is generated at the last sampling time point S7 and serves to recover the last sampling $A_6$ is applied. This means that all AND-gates of the release unit are inactive up to the last sampling time point S7 and an output signal is only generated after this last sampling time point S7 or an output line $PD_0$-$PD_5$ is active so that noise on the output side is prevented.

The logic functions of the two blocks of the error recognition unit 4 and the evaluation unit 2 can be combined so that the following specifications result for the output lines $PD_0$-$PD_5$:

$PD_0$<=UP2 AND NOT (UP1) AND NOT (UP0) AND NOT (DN0) AND NOT (DN1) AND NOT (DN2)

$PD_1$<=UP1 AND NOT (UP2) AND NOT (UP0) AND NOT (DN0) AND NOT (DN1) AND NOT (DN2)

$PD_2$<=UP0 AND NOT (UP1) AND NOT (UP2) AND NOT (DN0) AND NOT (DN1) AND NOT (DN2)

$PD_3$<=DN0 AND NOT (UP1) AND NOT (UP0) AND NOT (UP2) AND NOT (DN1) AND NOT (DN2)

$PD_4$<=DN1 AND NOT (UP1) AND NOT (UP0) AND NOT (DN0) AND NOT (UP2) AND NOT (DN2)

$PD_5$<=DN2 AND NOT (UP1) AND NOT (UP0) AND NOT (DN0) AND NOT (DN1) AND NOT (UP2)

In contrast to the state automatons, in the case of phase detector according to the invention the state is only controlled via the 7 bit word, which results from the inputs of the buffers in the sampling unit 1. A previous state has no effect on the actual state. As a result, reliability is increased and conventional risks in the case of state automatons are reduced. Depending on the behaviour of the input signals, the phase detector can assume one of seven states. Although generally each state can be reached from any state, the paths shown in FIG. 9 correspond to normal control behaviour. In this case, a large phase error at the beginning is minimized, until state D or E is reached. Missing edges in the reference signal 6 or an incorrect sampling produce the state A, which is only abandoned with suitable input signals (this means a scanned edge in the reference signal 6 in the event of no error). If the phase difference is minimized, the phase detector only alternates in the ideal case between states D and E.

A corresponding change in synthesis-capable VHDL is possible on the basis of the state diagram in accordance with FIG. 9. Gates in purely complementary logic can also be realized without difficulty and this is essentially in regard to high frequency applications, CML (current mode logic) or ECL (emitter coupled logic). The parallel structure of the phase detector in accordance with the present invention allows an advantageous embodiment in the case of high frequency applications in the gigabit data rate range. The phase detector according to the invention is not critical in regard to running time due to the regular structure.

In order to minimize or totally prevent noise or spikes, it can also be proposed that the pulse of the sampling time point S7 is again further delayed before it activates the error recognition unit 4. This time-lag as well as the switching time of the buffer enabled at the sampling time point S7 advantageously remains shorter than the time difference which comprises the rising edges of the sampling time point S6 and S7 or S0 and S1.

Spikes can also be avoided if an additional level is implemented with buffers after the combinational level i.e. the evaluation unit 2. This, for example, can be implemented by six D flip-flops, the data inputs of which are connected with the outputs of the combinational level and in the case of which the timing, that is to say the reception of the available signals by the buffers takes place via the delayed signal at the sampling time point S7. In this case, it must be ensured that the delay period for the signal at the sampling time point S7 is long enough and the rising edge of which only appears therefore if the signals are already applied in a stable manner to the output lines $PD_0$-$PD_5$. Time-staggered switching is therefore no longer the case and spikes are prevented at the outputs.

In the case of the phase detector according to the invention, a phase detector functioning robustly and in a stable manner also without edge changes in the reference signal can be created by means of variable multiple sampling and the binary transmission characteristic resulting from this. The increase of the transmission characteristics can be varied by the gap between each of the sampling time points S1-S7. An additional possibility to match the amplification of the phase detector is provided by weighting in the subsequent evaluation of the output pulses. Both analogue as well as digital further processing of the output pulses is feasible. The phase detector according to the invention can be implemented both with analogue as well as with digital switching circuits. Preferably, the phase detector according to the invention is used in arrangements to reconstruct data. In this case, the use of the phase detector is dependent on the choice of the possible topology. This is called phase alignment or phase picking with loops of the first or higher order.

The invention claimed is:

1. A method for generating an output signal in dependence on a phase difference between a periodic reference signal and a periodic control signal, comprising sampling the reference signal within a period of the control signal at certain sampling time points, and in dependence on all samplings of the reference signal obtained within a period of the control signal, generating the output signal in such a way that it assumes one of at least three states.

2. A method according to claim 1, comprising sampling the reference signal in binary format.

3. A method according to claim 1, comprising sampling the reference signal N-times within a period of the control signal and generating the output signal in such a way that it assumes one of at least N−1 states, where N>=4.

4. A method according to claim 1, comprising sampling the reference signal at least four times within a period of the control signal.

5. A method according to claim 1, comprising determining by means of samplings of the reference signal obtained within a period of the control signal between which samplings a state change of the reference signal has taken place and controlling the output signal dependent on the state of change of the reference signal.

6. A method according to claim 1, comprising determining whether samplings of the reference signal obtained within a period of the control signal agree with at least one sampling error pattern and, in such a case, controlling the output signal so that it assumes an error state.

7. A method according to claim 6, characterized in that the at least one sampling error pattern in the chronological sequence of the samplings has at least two or no state changes of the reference signal.

8. A method according to claim 1, characterized in that the sampling time points are within a time period, which is as long as half the period of the control signal, whereby a sampling time point occurs at the beginning and at the end of the time period.

9. A method according to claim 1, characterized in that the sampling time points are equidistant.

10. A method according to claim 1, comprising reducing the gaps between chronologically adjacent sampling time points in the chronological sequence of the sampling time points and then increasing the gaps between chronologically adjacent sampling time points in the chronological sequence of the sampling time points.

11. A method according to claim 10, characterized in that the gaps between the sampling time points are exactly symmetrical to another in relation to their chronological sequence.

12. A method according to claim 1, comprising only generating or releasing the output signal at or after the last sampling time point within a period of the control signal.

13. A method according to claim 12, comprising only generating or releasing the output signal a certain first time delay after the last sampling time point.

14. A method according to claim 1, comprising storing at each sampling time point the instantaneous state of the reference signals at least until all sampling time points have passed within a period of the control signal and the output signal has been generated.

15. A method according to claim 13, comprising storing at each sampling time point the instantaneous state of the reference signals at least until all sampling time points have passed within a period of the control signal and the output signal has been generated and the first time delay is at least as long as a storage time delay necessary for storing the state of the reference signal at the last sampling time point.

16. A method according to claim 1, comprising comparing for each gap between two chronologically adjacent sampling time points the samplings of the adjacent sampling time points, and if a difference of the samplings is detected, generating an intermediate signal, which indicates a state change of the reference signal in the respective gap of the adjacent sampling time points, and generating the output signal in dependence on the intermediate signals.

17. A method according to claim 16, comprising storing the intermediate signals with or after the last sampling time point and only generating or releasing the output signal after the intermediate signals have been stored.

18. A method according to claim 16, comprising storing the intermediate signals with or after the last sampling time point and only generating or releasing the output signal after the intermediate signals have been stored and only generating or releasing the intermediate signals a certain second time delay after the last sampling time point.

19. A method according to claim 18, characterized in that the second time delay is at least as long as the time for storing the intermediate signal last generated.

20. A method according to claim 1, characterized in that the reference signal is a digital data signal and the frequency of a controllable oscillator; and controlling the output signal, of which is the control signal, in such a way that the control signal has the frequency, with which individual bits in the data signal are transferred.

21. A method according to claim 20, comprising recovering, by means of the control signal, the data transferred by the data signal.

22. A method according to claim 1, characterized in that the output signal is a digital binary word.

23. A method according to claim 22, comprising assigning each digit of the binary word to a state of the output signal, wherein each digit of the binary word can assume an active state, which indicates the assigned state of the output signal.

24. An apparatus for generating an output signal in dependence on a phase difference between a periodic reference signal and a periodic control signal, characterized in that the apparatus has a sampling unit for sampling the reference signal within a period of the control signal at certain sampling time points and an evaluation device, which is equipped in such a way that it generates the output signal in dependence on the samplings of the reference signal obtained from the sampling unit within a period of the control signal, in such a way that the output signal ($PD_0$-$PD_6$) assumes one of at least three states.

25. An apparatus according to claim 24, characterized in that the evaluation unit is equipped in such a way that it samples the reference signal at the sampling time points in binary format.

26. A method according to claim 1, wherein the output signal is generated based only on the samplings recited therein, except to the extent that for forming the output signal the information regarding the position of the sampling time points is used.

27. A method according to claim 1, characterized in that the three states represent either of two or three different magnitudes of phase difference.

28. A method according to claim 1, characterized in that the reference signal is a data signal.

29. An apparatus according to claim 24, wherein the output signal is generated based only on the samplings recited therein, except to the extent that for forming the output signal the information regarding the position of the sampling time points is used.

30. An apparatus according to claim 24, characterized in that the three states represent either of two or three different magnitudes of phase difference.

31. An apparatus according to claim 24, characterized in that the reference signal is a data signal.

* * * * *